United States Patent [19]

Vlahu

[11] Patent Number: 5,625,265

[45] Date of Patent: Apr. 29, 1997

[54] COMPACT, HIGH EFFICIENCY ELECTRONIC MOTOR CONTROLLER WITH ISOLATED GATE DRIVE FOR POWER TRANSISTORS

[75] Inventor: Saso P. Vlahu, Munster, Ind.

[73] Assignee: Kollmorgen Corporation, Waltham, Mass.

[21] Appl. No.: 473,214

[22] Filed: Jun. 7, 1995

[51] Int. Cl.⁶ .................................................. H02P 7/00
[52] U.S. Cl. .................... 318/254; 318/599; 388/804; 363/41
[58] Field of Search ........................... 318/811, 807, 318/809, 599, 606, 607, 608, 600, 601, 603, 254, 138; 363/41, 98, 132; 388/819, 804, 805, 812

[56] References Cited

U.S. PATENT DOCUMENTS

| | | | |
|---|---|---|---|
| 3,577,057 | 5/1971 | Dyer | 318/811 |
| 3,636,422 | 1/1972 | Miller et al. | 318/265 |
| 4,447,771 | 5/1984 | Langley et al. | |
| 4,490,661 | 12/1984 | Brown et al. | |
| 4,686,437 | 8/1987 | Whited. | |
| 4,866,556 | 9/1989 | Hebenstreit | 361/91 |

*Primary Examiner*—John W. Cabeca
*Attorney, Agent, or Firm*—Morgan & Finnegan, L.L.P.

[57] ABSTRACT

A motor controller operable at a PWM (pulse width modulated) repetition rate above 6,000 Hz. A special saturable transformer with an interwinding capacitance of less than 5 picofarads is used to isolate the electronic control circuits from the power stage. PWM pulses are supplied to the saturable transformer such that the leading and trailing edges of the pulses pass through to a Schmitt trigger circuit which reconstructs the original pulse.

2 Claims, 7 Drawing Sheets

COMPACT, HIGH EFFICIENCY ELECTRONIC MOTOR CONTROLLER WITH ISOLATED GATE DRIVE FOR POWER TRANSISTORS

This invention relates to a compact, high frequency, electronic motor controller, and more particularly, to such electronic motor controllers with isolated gate drives for IGBT power transistors.

BACKGROUND OF THE INVENTION

U.S. Pat. No. 4,686,437 to Langley et al. entitled Electromechanical Energy Conversion System describes a motor control system whereby a microprocessor or similar electronics can be used to control electric motors. The sensitive electronics are coupled to the motor via a power transistor switching stage wherein the transistors operate in on/off fashion to control the current flow to the motor windings in accord with control signals from the microprocessor. The microprocessor receives feedback from the motor indicating rotor position and other controllable parameters. The microprocessor may also receive command signals usable for servo control. The command signals and the feedback signals are compared to determine the frequency, amplitude and phase for the winding energization, and the rotor position feedback is used to determine the proper commutation of the winding excitation. The microprocessor, either alone or with other components, provides on/off control signals to the power stages which, in turn, supply current to the windings with the desired amplitude, frequency and phase commutated according to the rotor position. Most present day servo motor control systems utilize this basic control system.

U.S. Pat. Nos. 4,447,771 and 4,490,661 to Whited and Brown et al., respectively, disclose motor control systems in which digital electronics control power switching transistors via a pulse width modulator (PWM) so that the excitation current to the motor is a function of the pulse width. Both Whited and Brown et al. disclose techniques for controlling the phase angle of the excitation current relative to the rotor position to improve the torque efficiency of the system.

Most present day systems use pulse width modulation as disclosed by Whited and Brown et al. to convert the control signals from the sensitive electronics to the desired excitation currents for the motor windings. In such systems used to control large motors isolation is necessary between the sensitive electronic controller and the brute force power stages that drive the motor. Most present day systems employ optical coupling which provides a high degree of isolation in the present controller designs which operate at a PWM switching rate of about 2 KHz.

There is an ever present desire to provide smaller and less costly controllers and controllers with high overall system efficiency. The invention provides those advantages for any size motor. However, the advantages are more pronounced for large motors in the range of 10 to 150 horsepower and most pronounced for the very large motors in the 150 to 500 horsepower range. In the higher horsepower ranges inefficient use of components and inefficient overall system design directly translates into high controller costs and high usage costs.

One approach to smaller and less costly controllers is to increase the switching frequency of the PWM power stage. In theory at least, higher switching frequencies should make it possible to control the needed power for large motors using smaller and less expensive components. However, the problems associated with operating the power stages at higher switching frequencies have proven to be either insolvable or prohibitively costly both in space and money. High frequency noise can bleed off power from the system and seriously affect the system efficiency. Noise of the common mode variety (noise that goes up and down together on a parallel conductor pair), can be particularly difficult to detect and even more difficult to eliminate.

SUMMARY OF THE INVENTION

An object of the present invention is to provide improved isolation between the sensitive electronic stages and the associated power stages.

Another object of the present invention is to provide effective isolation coupling between the electronic stages and the associated power stages in a motor control system where the power stage can operate at a switching rate in the range of above 6,000 Hz.

Still another object of the invention is to provide a motor controller operating at a high power switching rate in the range above 6 KHz with little high frequency power loss and negligible noise generation.

Yet another object is to provide a motor controller with higher system efficiency, i.e. maximum torque, relative to energy applied to the controller.

Optical coupling, which provides effective coupling isolation at low switching rates, for example, about 2,000 Hertz, has too much time delay for effective operation in the range above 6,000 Hz. Furthermore, switching at the 6,000 Hz rate can generate transients as high as 100 MHz which are not effectively decoupled with the optical devices. Known high frequency, electronic transformer coupling is too expensive and complicated for effective use in a motor controller.

The pulse transformer in the form of a dynamic coupling inductance according to the invention includes spaced apart primary and secondary windings wound around a common high permeability core. The flux return path for flux through the core is configured to surround the windings. The core is configured so that the core is saturable in normal operation. The windings are spaced as far apart as possible to minimize the inter-winding capacitance. The windings are wound using a small number of turns and small wires to minimize the surface area of the winding to thereby reduce winding to shell and winding to winding capacitance.

If a rectangular pulse is applied to the primary winding of the pulse transformer, a positive spike appears at the secondary winding corresponding to the rise time and a negative spike appears corresponding to the fall time. The rise time of the positive spike occurs while the core is being driven into saturation and the windings are coupled to one another. Once saturation is reached the windings are decoupled. A similar operation takes place during the fall time. By careful design according to the concept of the invention, turn on and turn off times for pulses passing through the pulse transformer are as little as 100 nanoseconds which is about 10 times faster than could be accomplished using optical coupling.

Rectangular pulses from a microprocessor and other electronic stages pass through the saturable pulse transformer as a positive and a negative spike pair which is supplied to a Schmitt trigger that reconstitutes the rectangular pulse for control of the power transistors. With the arrangement according to the invention only the leading and trailing edges of the pulses pass through the pulse transformer. As a result power stage switching can be achieved at the rate of 10A/100 nanoseconds. Using conventional components, switching for large motor control systems can be on the order of about 250 nanoseconds to 450 nanoseconds, depending on the motor size. Faster switching speeds as low as 150 nanoseconds can be achieved by using special high speed components. Double pulsing problems (where a turn off command is received before the power stage is fully turned on) are virtually eliminated by the high speed switching according to the invention.

The coupling between the electronic and power stages according to the invention results in a very high rejection of common mode noise and elimination of the related energy absorption. Contrary to conventional design, the primary and secondary windings are located on a ferrite core and separated as far as possible to minimize inter-winding capacitance. A minimum number of winding turns and a small diameter wire are used for the winding to minimize the conductive surface area. Although this structure provides relatively poor magnetic coupling between the windings, it is sufficient since only the leading and trailing edges of the pulses actually pass through the transformer.

BRIEF DESCRIPTION OF THE DRAWINGS

The forgoing and other objects are achieved with embodiments as described in the following specification which includes the drawings as follows.

DETAILED DESCRIPTION OF THE INVENTION

Figure 1:
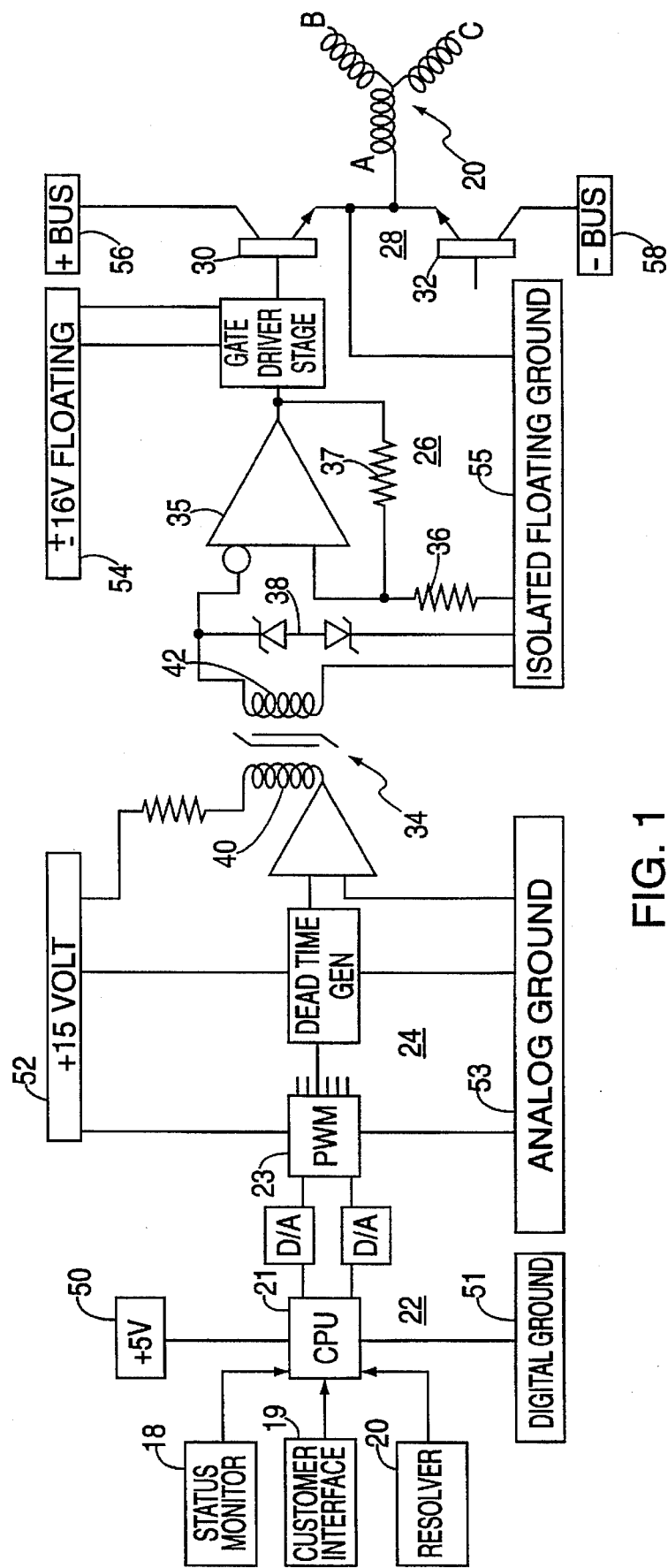
FIG. 1 is a block diagram showing the overall layout of a motor controller according to the invention.

The motor controller illustrated in FIG. 1 controls a brushless motor 20 having a three phase stator winding including winding phases A, B, and C. The winding phases are each displaced by 120 electrical degrees. Although the invention can be used with any type of brushless motor, it is particularly useful with motor having three phase stator windings operating in the current pulse range above 2,000 Hertz and preferably in the range of 6,000 to 20,000 Hertz or higher. Although the invention is useful with any size motor, the advantages are particularly important in controlling large and very large motors.

The motor controller includes a digital section 22 including a central processor unit (CPU), such as a microprocessor, to receive control commands and motor feedback signals to generate sinusoidal signals corresponding to the frequency, phase and amplitude of the motor excitation currents. The signals from the digital section pass through an analog section 24 including a PWM (pulse width modulator) to convert the sinusoidal signals into corresponding pulse trains of pulses with varying width. The pulse trains pass through a gate drive 26 to the main power transistors 28.

The digital section generates two sinusoidal signals for the three phase motor excitation, the third signal being derived in analog section 24 as the sum of the other two phases. The analog section generates complimentary pulse trains for each of the three phases, or a total of six pulse trains, only one of which is shown in FIG. 1. The six pulse trains each pass through a separate gate drive (only one being shown) to control the conductive state of the six power transistors (only two of which are shown).

The microprocessor can be programmed to produce a sinusoidal excitation current of any desired phase, amplitude, and frequency to almost any type of motor including synchronous, induction or reluctance motors. The system can also be programmed to calculate excitation phase angle for maximum torque producing efficiency according to the aforementioned Whited and Brown et al. patents.

Figure 7:
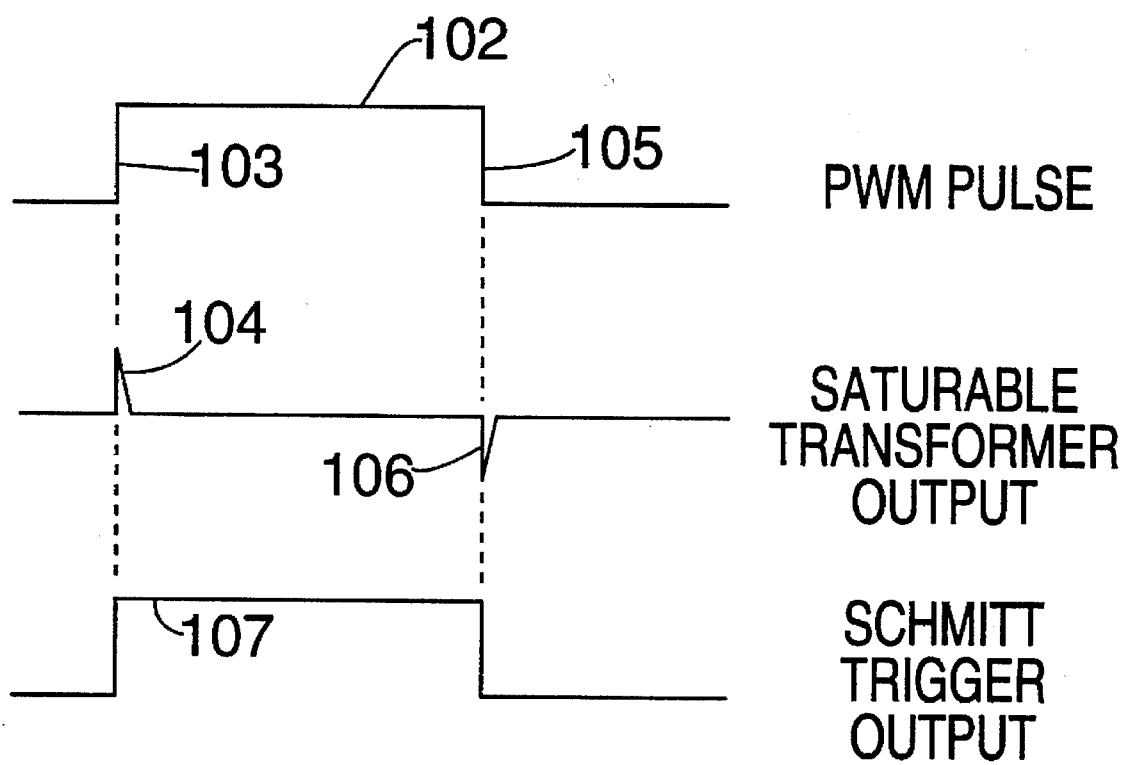
FIG. 7 shows PWM pulses identifying respective leading and trailing edges.

In the operation of the controller it is essential that the power stages, including gate drives 26 and power transistor stages 28, be isolated from the sensitive electronic stages 22 and 24. For a conventional controller operating at a PWM rate of about 2,000 Hertz, the necessary isolation can be achieved with an optical coupler. But to reduce the size of components, and to achieve other advantages, a higher PWM pulse repetition rate in the range 6,000 to 20,000 Hertz is used. To achieve the necessary isolation without prohibitive leakage losses and noise problems, a specially constructed ferrite core transformer 34 with extremely low interwinding capacitance is used in combination with a Schmitt trigger located in gate driver 26. When a PWM pulse 102 (FIG. 7) is applied to the pulse transformer, the leading edge 103 of the pulse drives the core into saturation. While being driven into saturation, primary winding 40 is coupled to secondary winding 42 and produces a sharp spike 104 on the secondary winding. The trailing edge 105 of the applied pulse likewise drives the core out of saturation and produces a sharp negative spike 106. Comparator 35 and resisters 36 and 37 are connected in a Schmitt trigger configuration. The positive spike turns the trigger on and the negative spike turns the trigger off. Thus, rectangular PWM pulses are passed to the gate drivers by passing the leading and trailing edges through transformer 34 to the Schmitt trigger which reconstructs the rectangular pulses 107.

Not only is it necessary to isolate the power stages from the sensitive electronics stages, but is also necessary to achieve similar isolation in the power supplies for the various stages. The CPU and other components of the digital section 22 require a +5 volt supply 50 and ground return 51. The PWM unit 23 and other components in analog section 24 require a +15 volt supply 52 a ground return 53. Each of the six gate drivers 26 require a separate floating +16 volt supply 54 with a floating ground 55. The power for driving the motor is supplied to the power transistors from a +bus 56 and a −bus 58. The structure of the various power supplies will be described hereinafter. However, the significant point is that the power stages connected to the output of isolation pulse transformer 34 have separate power supplies isolated from the power supplies for the electronic sections 22 and 24 connected to the primary of the pulse transformer.

Figure 2:
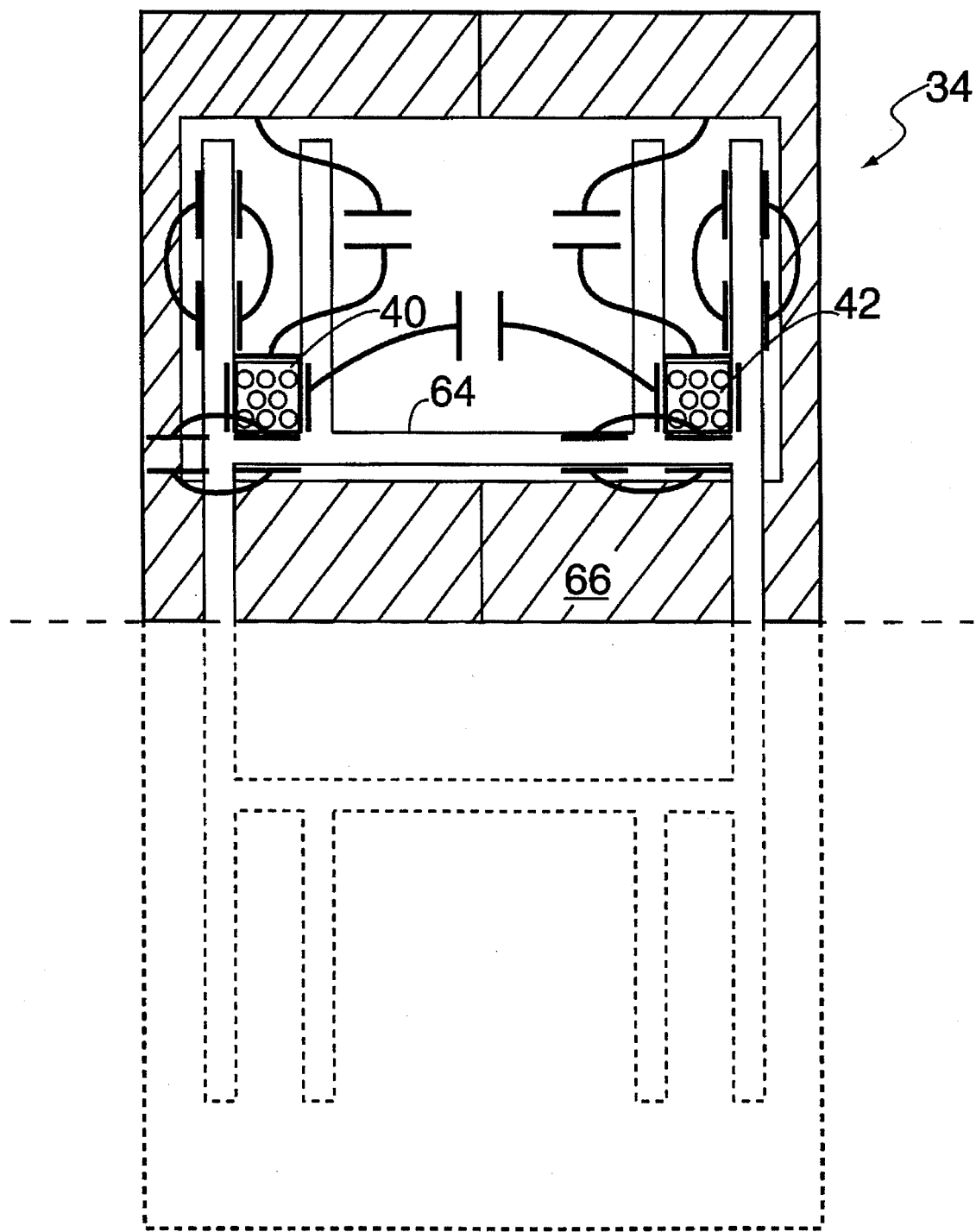
FIG. 2 is a cross-sectional view of the high frequency pulse transformer according to the invention.

Pulse transformer 34 is shown in cross-sectional detail in FIG. 2. The transformer includes primary winding 40 and secondary winding 42 wound on a bobbin 64 so that the primary and secondary windings are well separated. A ferrite core 66 passes through the center of the windings and returns around the outside of both windings. In other words the core is constructed to completely surround the windings. Preferably, the core is a two piece structure, as shown in FIG. 2, with the core return path completely surrounding and enclosing the windings to provide self shielding from radiated noise. The core material should be of a high permeability material to minimize the required number of winding turns. A powder ferric material type W provides good results. Materials such as Suppermeloy or Square 80 provide better results, but are too expensive for most applications.

The pulse transformer is designed to pass rectangular pulses with a repetition rate in the range of 6,000 to 20,000 Hertz which include high frequency transients in the range of 1 M Hz to 100 M Hz. These high frequency transients can create severe power loss and noise problems. The winding configuration is critical to reducing the power loss and noise problems to acceptable levels. First, the primary and secondary windings are well separated and placed as far apart as possible to minimize the interwinding capacitance CWW. As shown in FIG. 2, a spacing of 200–300 mils, on the order of eight times the width of the windings, is preferred. This spacing between the windings reduces the interwinding capacitance (CWW). A higher wire gauge size, (i.e. minimum diameter wire) such as gauge 37 is used to minimize winding surface areas which in turn minimize the winding to core capacitance (CWCC) and (CWCS). The number of winding turns is selected to produce an inductance of approximately 1 mH. Ten to thirteen turns have been found to produce the desired results. A larger number of turns increases the ratio relationship between the capacitance and inductance causing self oscillation which is not acceptable. Less than ten turns provides a ratio of capacitance to leakage inductance that attenuates the applied signal to an unacceptable degree. The total leakage capacitance according to the design of the invention has been measured at 0.08 to 0.2 picofarads which results in very low noise and very low high frequency power losses. To be effective, the pulse transformer must have a total leakage capacitance of 5 picofarads and preferably below 1 picofarads. Conventional designs have been measured in the range of 32–43 picofarads and were found to be ineffective.

When a rectangular pulse is applied to the pulse transformer, the high permeability core quickly goes into saturation and produces a short positive spike in the secondary winding corresponding to the leading edge of the applied pulse. Similarly, the trailing edge of the applied pulse produces a sharp negative spike on the secondary winding. The rise time for the spikes is on the order of 100 nanoseconds. With these short time delays the pulse transformer according to the invention can be used to pass information for pulses in the range of 6,000–20,000 Hz with minimal radiation and noise losses.

Figure 3:
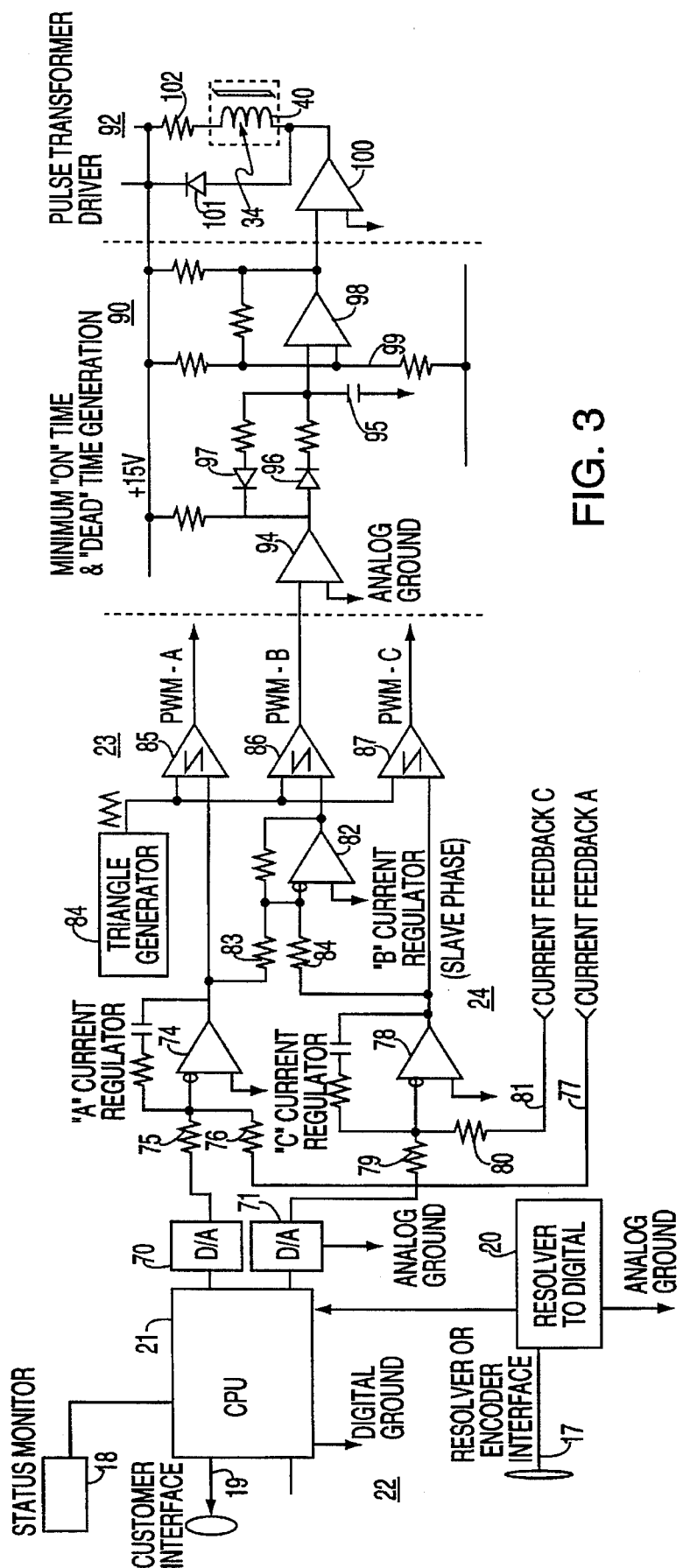
FIG. 3 is a schematic diagram of the electronic stages connected to the primary side of the pulse transformer.

FIG. 3 is a schematic diagram illustrating the electronic sections of the motor controller connected to supply the primary winding of pulse transformer 34. These sections include in the central processing unit (CPU) 21 and other digital components in digital section 22. Also included is the pulse width modulator (PWM) 23 and other analog components in the analog electronics section 24.

The central processing unit can be a microprocessor or other type of digital processing electronics. The CPU receives rotor position information from the motor being controlled via a resolver or position encoder 17 which provides rotor position information. The rotor position information is converted to a digital form by a resolver-to-digital converter 20. The position information is used to commutate the winding excitation calculated by the CPU according to rotor position. The position information can also be used for a servo loop positioning of the motor shaft. Also, the CPU can calculate motor speed from the rate of change of the rotor position. The CPU receives data from a status monitor 18 which provides status information for any parameter being controlled and is useful in calculating the motor excitation. A customer interface 19 provides command information such as the desired speed, desired torque or desired position.

If the motor controller is operated as a velocity servo, for example, the CPU is programmed to compare the speed command with the feedback signal indicating actual speed to determine the torque require to achieve the desired speed. Likewise, servo position control can be achieved by comparing the desired position to the actual position to determine the motor torque required to reach the desired position. The CPU calculates a incrementally synthesized excitation signal including the frequency, phase and amplitude of the current excitation to be supplied to the motor. The CPU furnishes such a sinusoidal signal to a digital-to-analog (D/A) converter 70 for controlling the excitation at one phase of the motor. A second such signal, displaced by 120 electrical degrees, is supplied to another D/A converter 71 to control excitation for a second motor phase. The third phase is the sum of the other two phases and therefore need not be calculated by the CPU.

D/A converters 70–71 provide sinusoidal excitation signals to the PWM stage 23 which converts the excitation signal into pulse trains wherein the pulse width is proportional to the instantaneous signal amplitude. The pulse width determines the turn-on and turn-off times for the power transistor controlling current flow to the motor windings.

As described hereinafter, current sensors are provided for sensing the current flow to the motor windings to provide corresponding voltage feedback signals 77 and 81. The feedback signal voltages are compared with the desired excitation signal values calculated by the CPU. The comparison of the calculated value for phase A and the actual feedback value of the current are compared and the result of the comparison appears as the output of amplifier 74. Similarly, the feed back signal 81 is applied to the summing junction of amplifier 78 for comparison with the calculated signal applied to resistor 79 so that the results of the comparison appear at the output of amplifier 78. The signals for phases A and C at the outputs of amplifiers 74 and 78, respectively, are summed in operational amplifier 82 and summing resistors 83 and 84. Since the amplifiers 74 and 78 produce signals displaced by 120 electrical degrees, the remaining phase B is derived by summing phases A and C in amplifier 82.

The PWM pulse train is generated by comparing the excitation signal value from one of amplifiers 74, 78 and 82 to a triangular waveform value generated by triangle generator 84. The signal value comparisons are achieved by comparators 85, 86 and 87 for phases A, B and C respectively. More specifically, the excitation signal value for phase A is compared with triangle waveform generator 84 such that when the excitation signal value is below the triangular wave value, the output of comparator 85 is ON, and when the signal value is above the triangular wave value, the output of comparator 85 is OFF. The greater the excitation signal value, the wider the pulse emerging from comparator 85 and therefore the greater the current supplied to the motor winding. The smaller the signal value, the narrower the pulse and the smaller the current supplied to the motor winding. PMW pulse trains for phases B & C are generated in similar fashion.

The base frequency for the triangular wave in most current systems is on the order of 2,000 Hz or less. In the motor controller according to this invention the repetition rate of the triangular wave can be in the range of 6,000–20,000 Hz. The higher the frequency on the PWM pulses the smoother the control and the smaller the size of the components. Higher PWM frequencies can be employed using the same pulse transformers by using faster Schmitt triggers and gate drivers.

To simplify the illustration only the phase B section for the "dead" time generation unit 90 and the pulse transformer driver 92 are shown in FIG. 3. An actual system would include similar circuits 90 and 92 for each of the three phases.

A minimum ON time and "dead" time generator 90 includes a comparator 94 which receives the PWM signal. A capacitor 95 is coupled to the comparator output by a charging path through diode 96 and a discharging path through diode 97. When the pulse signal supplied by amplifier 94 goes positive, capacitor 95 is charged to this value very rapidly via forward biased diode 96. Subsequently, when the output of amplifier 94 drops to zero, capacitor 95 discharges via diode 97. The voltage stored in capacitor 95 is supplied to one input of a comparator 98 for a Schmitt trigger comparison with the voltage on a voltage divider 99. The parameters of the circuit are adjusted to provide a turn-on delay to ensure that there will be no "shoot through" where both power transistors of a complimentary pair are conductive at the same time. The circuit also protects against "double pulsing" where a transistor receives a turn-off pulse when it is only partially turned-on. To avoid such double pulsing the circuit delays the subsequent turn-off pulse until 2 microseconds after the turn-on pulse.

Amplifier 98 supplies the PWM pulse train to the primary winding 40 of pulse transformer 34 via an amplifier 100 which functions as a driver for the pulse transformer. Primary winding 40 is connected to the positive supply through a resistor 102. A diode 101 is connected across the series combination of register 102 and winding 40. The purpose of the diode is to bypass inductive spikes.

Figure 4:
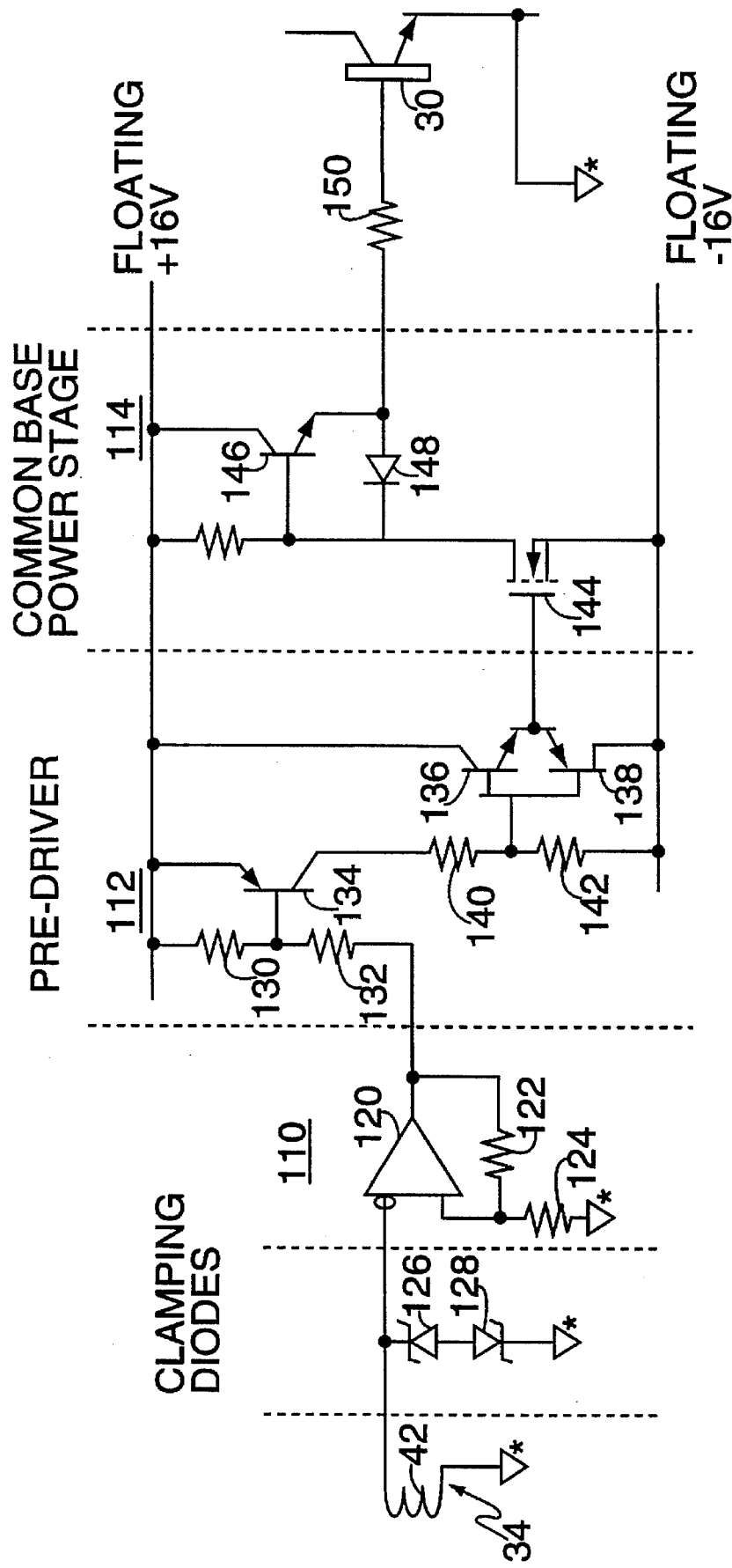
FIG. 4 is a schematic diagram of the gate driver including the pulse transformer and Schmitt trigger circuit connected to the secondary side of the pulse transformer.

The power stages connected to the secondary winding 42 of the pulse transformer 34 are shown schematically in FIG. 4. The power stages include a Schmitt trigger 110 used to reconstruct the PWM pulses, a predriver stage for amplifying the PWM pulses and a common base power stage 114 which provides the driving signal for the gate of the main power transistor 30.

Power transistor 30 is an isolated gate bipolar transistor (IGBT). Such transistors are intended to operate either in the saturated ON state or the blocked mode OFF state. The IGBT transistor is turned on by the application of a pulse to the gate and thereafter remains in the conductive state until pulsed in the opposite direction.

Schmitt trigger 10 includes a comparator 120 with a resistor 122 connected from the output to the plus input of the comparator. The plus input is also connected to ground via a resistor 124. Secondary winding 42 of the pulse transformer is connected between the negative input of the comparator 120 and ground. A pair of back-to-back Zener diodes is connected across secondary winding 42. The ratio of resistors 122 and 124 can be set to have trigger points at plus and minus 8 volts. However, the trigger points are not critical and can be in the range of 1 volt to 14 volts.

In the operation of the Schmitt trigger assume that the output of comparator 120 is initially negative and that the positive input is therefore set to minus 8 volts. When a positive pulse appears on the transformer secondary winding and exceeds the value of plus 8 volts, the circuit triggers to the ON state. In the ON state where the comparator output is plus 15 volts, the plus input shifts to plus 8 volts. The comparator output stays positive until such time as a negative pulse appears on secondary winding 42 and exceeds minus 8 volts. At this point the trigger circuit reverts to the initial OFF state. In this fashion, the spike pulses passing through the pulse transformer corresponding to the leading and trailing edges of the PWM pulses are effective to reconstruct the PWM pulse.

In order to get maximum rise time it is desirable that the pulse transformer produce spike pulses exceeding 15 volts. Zener diodes 126 and 128 limit the voltage appearing at the comparator input to protect the circuit components.

The predriver circuit 112 includes a PNP bipolar transistor and two transistors 136 and 138 interconnected in totempole fashion. The base of the transistor 134 is connected to the junction of resistors 130 and 132 connected between the plus supply and the output of comparator 120. The emitter of transistor 134 is connected to the +16 V supply and the collector is connected to the −16 V supply via series resistors 140 and 142. The junction of resistors 140 and 142 is connected to the bases of transistors 136 and 138. Transistors 134, 136 and 138 increase the pulse current sufficiently to drive the MOSFET power stage which in turn drives the gate of IGBT transistor 30. MOSFET transistor 144, connected between the +16 V supply and the −16 V supply, generates a voltage pulse of sufficient magnitude to render transistor 30 fully conductive in the saturated state.

Power stage 114 further includes transistor 146 between the plus supply and the gate of power transistor 30. Transistor 146 has a low collector-emitter voltage when in the conductive state and therefore serves to drive power transistor 30 into the hard saturation state when transistor 146 is conductive. Diode 148 connected across the emitter-base junction of transistor 146 protects against reverse bias and maintains the power transistor 30 in the blocking mode when in the OFF state.

The motor controller according to the invention is designed to operate in the range of 6,000 to 20,000 Hz PWM switching rates. To achieve operation at these frequencies it is necessary to have very fast ON/Off switching for the PWM pulses. Pulse transformer 34 can transfer pulses with a propagation time delay of less than 100 nanoseconds in either direction. The pulse transformer, Schmitt trigger and gate drive together can transfer PWM pulses in less than 700 nanoseconds for TURN-ON and less than 350 nanoseconds for TURN-OFF. With these TURN-ON and TURN-OFF rates, a PWM pulse rate of 20,000 Hz can be achieved. Even higher PWM switching rates can reasonably be achieved by using faster Schmitt trigger circuits and faster predriver and driver stages. Such high speed components are within the range of existing technology, but are relatively costly at present.

Figure 5:
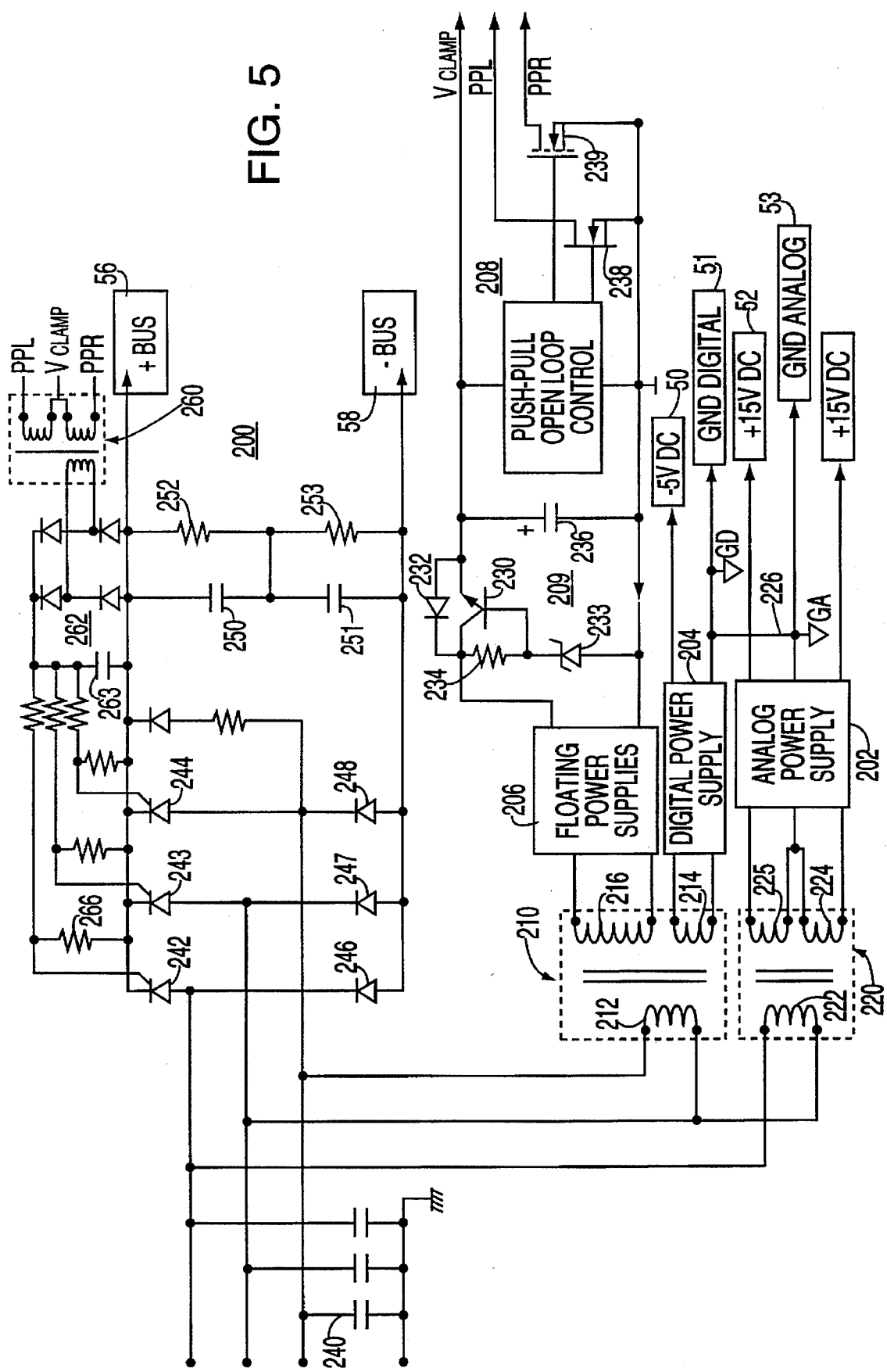
FIG. 5 is a schematic diagram of the power supplies for the motor controller.

The power for the motor controller is supplied by four power supplies shown schematically in FIG. 5. The four supplies include a main supply 200 which supplies power to the motor windings via the power transistors. Also included is an analog power supply 202, a digital power supply 204, and a floating power supply 206, the latter being used to provide power to the individual gate drivers.

Power for the controller is supplied from a three phase source on conductors U, V and W. Capacitors 240 are connected between the conductors and the chassis ground to filter out noise which would otherwise flow back onto the source.

The analog power supply is connected to the source through a transformer 220 which includes a primary winding 222 connected across two of the source conductors and a center tapped secondary winding 224–225. Secondary winding 224-225 is connected to an analog power supply to produce + and −15 volts on conductor 52 (shown in FIG. 1). The center tap of winding 224-225 is connected to analog ground 53.

Digital power supply 204 is connected to the source through a transformer 210. The transformer includes a primary winding 212 connected across two conductors from a three-phase source. The transformer also includes a secondary winding 214 connected to the digital power supply 204. The digital power supply produces a +5 volts on conductor 50 relative to a digital ground 51.

The digital power supply is connected to supply the digital components 22 as show in FIG. 1 and the analog power supply is connected to supply the analog components 24. The digital power supply has a ground return path separate from the analog power supply. The two ground return paths are tied together to the supplies such as by connection 226. Also, the digital power supply and the analog power supply are connected to the source through separate transformers 210 and 220. By interconnecting the ground returns at the source and by utilizing separate transformers, the two supplies are isolated from one another.

The floating power supply 206 is connected to the source via a secondary winding 216 in transformer 210. Power supply 206 provides a full wave rectified current to a capacitor 236 in a Zener power clamp circuit and the power stored on the capacitor is supplied to a push-pull oscillator 208.

The Zener power clamp includes an NPN transistor 230 so connected that the current from the supply passes through the collector-emitter circuit of the transistor to charge capacitor 236. A Zener diode 233 is connected between the base of the transistor 230 and ground and current flow through the Zener is supplied by a resistor 234 connected across the collector-base of the transistor. A diode 232 is connected across the collector-emitter circuit of the transistor. The Zener diode is selected having a voltage threshold of 14.5 volts. In operation the Zener clamp circuit permits current flow from supply 206 through transistor 230 while the potential across the capacitor is below 15 volts. When the potential across the capacitor exceeds the Zener potential and the base-emitter voltage drop of the transistor, the transistor becomes non conductive. As a result, the circuit clamps the potential across the capacitor at potential slightly above the Zener potential.

Figure 6:
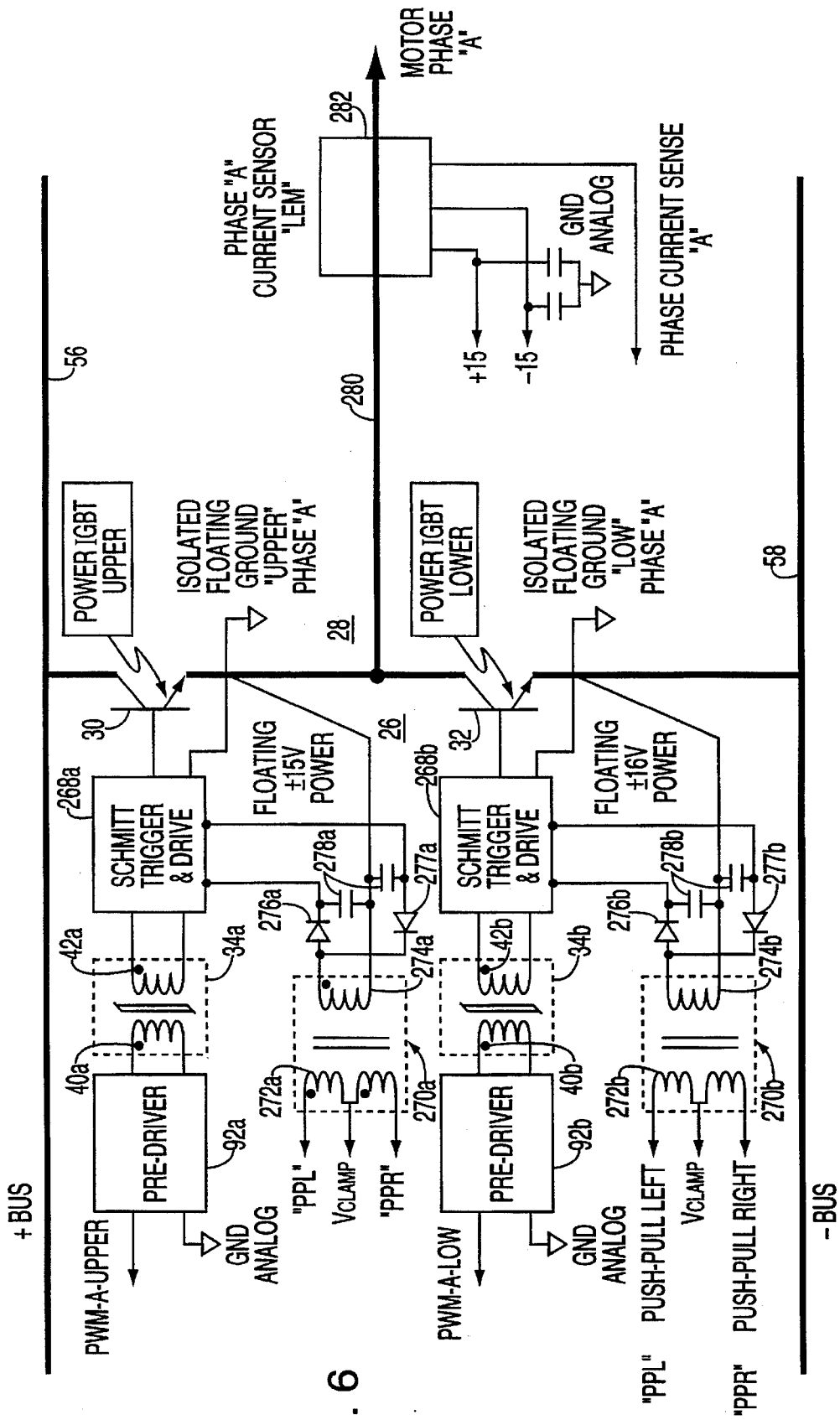
FIG. 6 is a schematic diagram of the independent floating ground supplies for the gate drivers.

Floating power supply 206 supplies power to the gate drive circuits. The supply to the gate drive circuits is preferable at a relatively high frequency to reduce the size of the isolating transformers (shown in FIG. 6). Accordingly, a push-pull open loop control circuit 208 is used which is in the nature of a push-pull oscillator operating at approximately 60 KHz. MOSFET transistors 238 and 239 are connected to the oscillator to operate in push-pull fashion such that the transistors alternately become conductive. The result is a pair of output currents designated PPL (Push Pull Left) and PPR (Push Pull Right) which are 60 KHz rectangular waves which become positive alternately. PPL, PPR and the $V_{clamp}$ conductors connect to transformers which provide independent floating power to each of the six gate drivers for the power transistors supplying the motor as shown in FIG. 6.

The main supply 200 includes three diodes 246-248 and three SCRs 242-244 connected to form a three phase full wave rectifying bridge. The rectified output is supplied to capacitors 250 and 251 in series with one another between +bus 56 and −bus 58. A resistor 252 is connected across capacitor 250 and a resistor 253 is connected across capacitor 251. The capacitors filter out the ripple from the power supply and resistors 252 and 253 providing a discharge path when the supply is turned off.

A transformer 260 is connected to supply conductors $V_{clamp}$, PPR and PPL to charge a capacitor 263 via a full wave bridge rectifying circuit 262. A potential across capacitor 263 is supplied to the gate elements of SCRs 242-244 via suitable voltage dividers. Capacitor 263 provides a DC filter for removing the high frequency ripple. A soft start for the main power supply can be achieved by delaying the initial operation of push-pull controller 208.

It is significant that the floating power supplies which power the gate drive circuits and are connected to the secondary windings of pulse transformer 34 are coupled to the source through a transformer 210. The analog power supply 202 supplies power to the electronic analog circuits 24 which are connected to the primary winding of pulse transformer 34. The floating power supply 206 and the analog power supply 202 are connected to the source through separate transformers 210 and 220 to thereby provide isolation between circuits on opposite sides of the pulse b transformer.

A separate floating supply is used with each of the gate drive circuits associated with the six IBGT power transistors. A complementary power transistor pair 30 and 32 for Phase A is shown in FIG. 6. Specifically, the collector of the upper transistor 30 is connected to the +bus and the emitter is connected to the phase A motor winding. The collector of lower power transistor 32 is connected to the phase A motor winding as well as the emitter of transistor 30. The emitter of transistor 32 is connected to the −bus. When a pulse is applied to transistor 30 which is positive at the gate relative to the emitter, transistor 30 becomes conductive and goes into saturation effectively connecting the motor winding to the +bus. On the other hand, if a pulse is applied to the gate of the transistor 32 relative to its emitter, the transistor is driven into saturation and connects the motor winding to the −bus.

Since the drive pulse for transistor 30 is relative to the emitter which can vary from the +bus to the −bus voltages, the drive circuit and the power supply must both be floating. For the upper power transistor, PWM-upper signal for phase A is applied at a predriver 92a which in turn is coupled to the primary winding of 40a of pulse transformer 34 previously described in connection with FIG. 2. The secondary winding 42a of the pulse transformer is connected to the Schmitt trigger and, in turn, to the gate driver in unit 268a.

A floating supply for the upper gate drive circuit includes a transformer 270a having a center tapped primary winding 272a. The center tap of the primary winding is connected to $V_{clamp}$ (See FIG. 5) and the ends of the windings are connected, respectively, to "PPL" and "PPR". One end of the secondary winding 274a is connected via diodes 276a and 277a to provide plus and minus 16 volts, respectively, to the gate drive circuit. The other end of the secondary winding provides the floating ground which is connected to the emitter of transistor 30. Capacitors 278a are connected between the floating ground and the diodes 276a and 277a. Since the gate drive and the power supply therefore are both transformer coupled, the gate drive and the floating power supply can both float according to the potential appearing at the emitter of transistor 30. The capacitors 278A filter the supplied voltage and also bypass noise. Common mode noise is rejected because of transformer coupling of transformer 270a. Common mode noise is further rejected by the transformer 210 coupling the floating supply to the source as shown in FIG. 5.

A separate floating supply is provided for the lower gate drive transistor 32. The gate drive is connected between the base and emitter of transistor 32. A floating supply including transformer 270b is essentially the same as that including transformer 270a. Plus and minus 16 volt floating power is supplied to the gate drive 268b and the floating ground is connected to the emitter of transistor 32.

As shown in FIG. 6, the conductor 280 connecting to phase A of the motor passes through a LEM current sensor 282. The LEM sensor is powered from the analog component supply. The output of LEM 282 is a voltage proportional to the current passing to the motor. A similar LEM sensor may be placed on each of the conductors energizing the three phase windings of the motor. The current feedback is supplied to comparators 274 and 278 in FIG. 3 via conductors 77 and 81.

The foregoing description has included a preferred embodiment of the invention. It should be obvious to those skilled in the art that there are many variations and other embodiments contemplated within the scope of this invention. The invention is more particularly defined in the appended claims.

I claim:

1. A controller for a brushless motor comprising:

an electronic pulse width modulator for providing signals indicating pulse width for one or more pulse trains for creating sinusoidal excitation current for one or more phases applied to said brushless motor, said pulse trains having a pulse repetition rate greater than 6,000 Hertz;

a saturable pulse transformer coupled
  to receive a pulse train from said pulse width modulator, and
  to pass through voltage spikes corresponding to the leading and trailing edges of pulses in said pulse train indicating pulse width as said saturable transformer goes into and out of saturation;

one or more power transistors coupled to said brushless motor for controlling current flow to said motor according to the conductive state thereof; and a gate drive coupled to control the conductive state of said power transistors, said gate drive being connected to said saturable pulse transformer to receive said voltage spike corresponding to said leading and trailing edges, said gate drive being capable of generating a rectangular pulse having a width corresponding to said leading and trailing edges; and wherein said saturable pulse transformer has an interwinding capacitance less than 1 picofarad.

2. A controller according to claim 1 wherein said gate drive includes a Schmitt trigger to generate rectangular pulses having a width corresponding to said leading and trailing edges.

* * * * *

UNITED STATES PATENT AND TRADEMARK OFFICE
CERTIFICATE OF CORRECTION

PATENT NO. : 5,625,265
DATED : April 29, 1997
INVENTOR(S) : Saso P. Vlahu

Page 1 of 7

It is certified that error appears in the above-identified patent and that said Letters Patent is hereby corrected as shown below:

The title page should be deleted and substitute therefore the attached title page.

United States Patent [19]

Vlahu

[11] Patent Number: 5,625,265
[45] Date of Patent: Apr. 29, 1997

[54] COMPACT, HIGH EFFICIENCY ELECTRONIC MOTOR CONTROLLER WITH ISOLATED GATE DRIVE FOR POWER TRANSISTORS

[75] Inventor: Saso P. Vlahu, Munster, Ind.

[73] Assignee: Kollmorgen Corporation, Waltham, Mass.

[21] Appl. No.: 473,214

[22] Filed: Jun. 7, 1995

[51] Int. Cl.[6] ............................................. H02P 7/00
[52] U.S. Cl. ........................ 318/254; 318/599; 388/804; 363/41
[58] Field of Search ............................ 318/811, 807, 318/809, 599, 606, 607, 608, 600, 601, 603, 254, 138; 363/41, 98, 132; 388/819, 804, 805, 812

[56] References Cited

U.S. PATENT DOCUMENTS 3,577,057  5/1971  Dyer .................................... 318/811
3,636,422  1/1972  Miller et al. ......................... 318/265
4,447,771  5/1984  Langley et al. .
4,490,661  12/1984  Brown et al. .
4,686,437  8/1987  Whited .
4,866,556  9/1989  Hebenstreit ............................ 361/91

Primary Examiner—John W. Cabeca
Attorney, Agent, or Firm—Morgan & Finnegan, L.L.P.

[57] ABSTRACT

A motor controller operable at a PWM (pulse width modulated) repetition rate above 6,000 Hz. A special saturable transformer with an interwinding capacitance of less than 5 picofarads is used to isolate the electronic control circuits from the power stage. PWM pulses are supplied to the saturable transformer such that the leading and trailing edges of the pulses pass through to a Schmitt trigger circuit which reconstructs the original pulse.

2 Claims, 7 Drawing Sheets

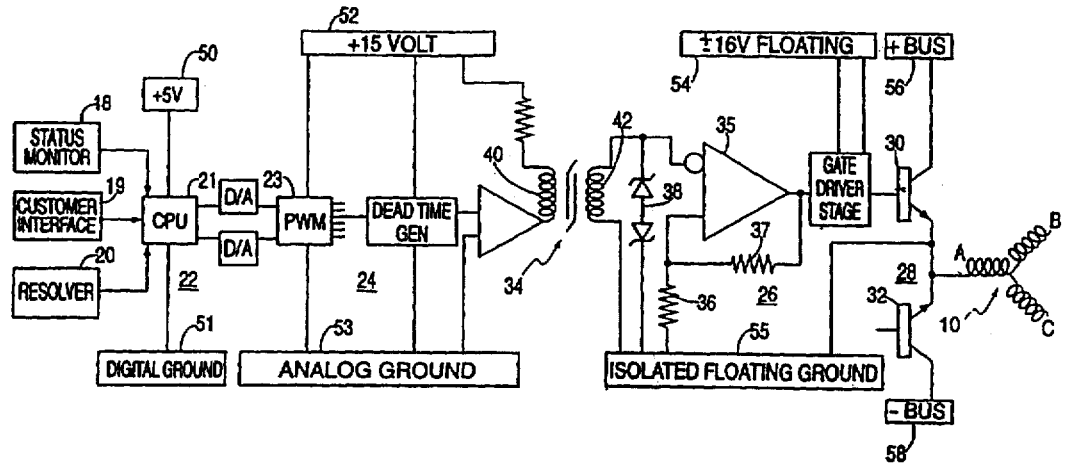

UNITED STATES PATENT AND TRADEMARK OFFICE
CERTIFICATE OF CORRECTION

PATENT NO.    : 5,625,265
DATED         : April 29, 1997
INVENTOR(S)   : Saso P. Vlahu Page 3 of 7

It is certified that error appears in the above-identified patent and that said Letters Patent is hereby corrected as shown below:

Figure 1, delete,

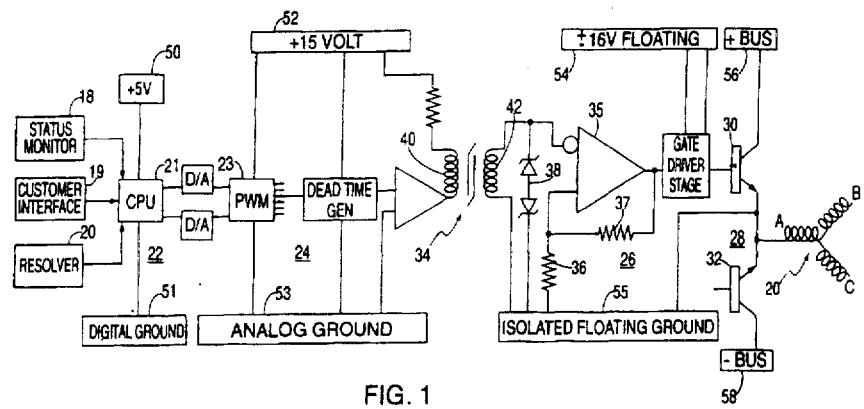

FIG. 1 and insert,

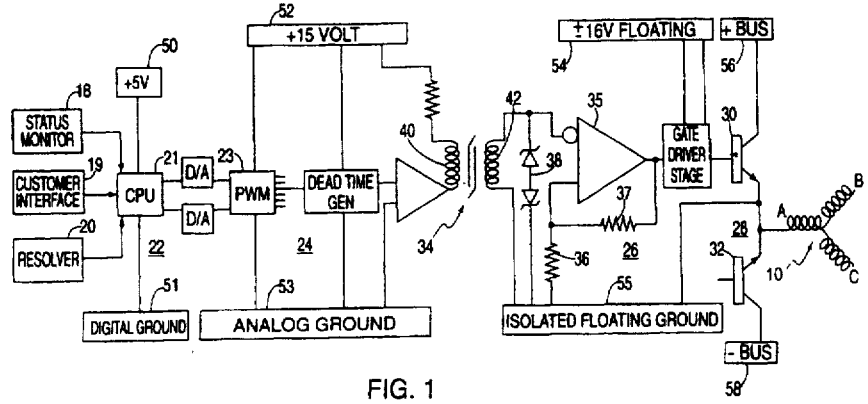

FIG. 1

UNITED STATES PATENT AND TRADEMARK OFFICE
CERTIFICATE OF CORRECTION

PATENT NO. : 5,625,265
DATED : April 29, 1997
INVENTOR(S) : Saso P. Vlahu

It is certified that error appears in the above-identified patent and that said Letters Patent is hereby corrected as shown below:

Figure 3, delete,

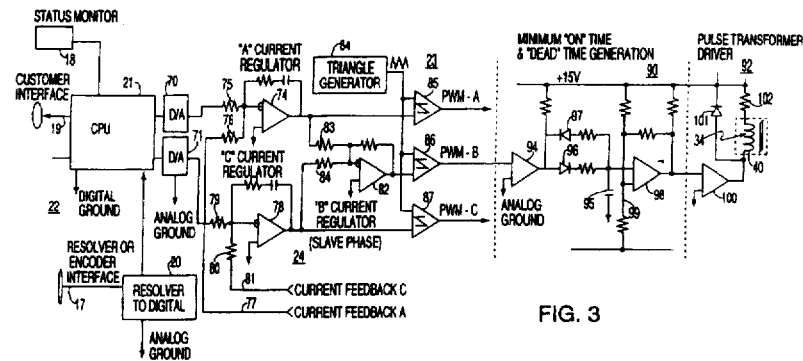

FIG. 3 and insert,

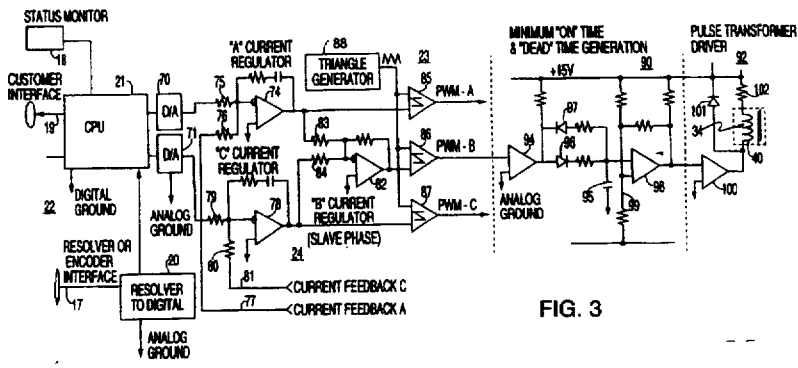

FIG. 3

UNITED STATES PATENT AND TRADEMARK OFFICE
CERTIFICATE OF CORRECTION

PATENT NO. : 5,625,265
DATED : April 29, 1997
INVENTOR(S) : Saso P. Vlahu

Page 5 of 7

It is certified that error appears in the above-identified patent and that said Letters Patent is hereby corrected as shown below:

Figure 5, delete,

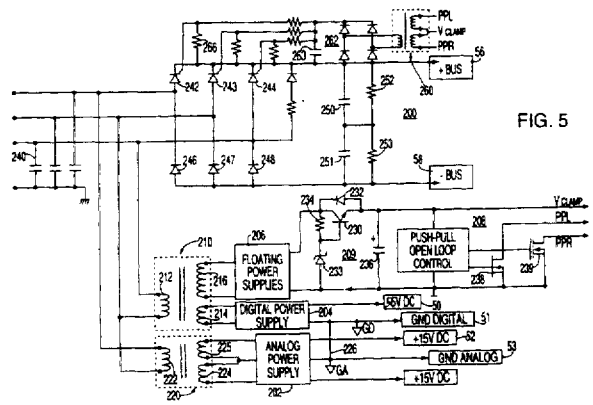

FIG. 5 and insert,

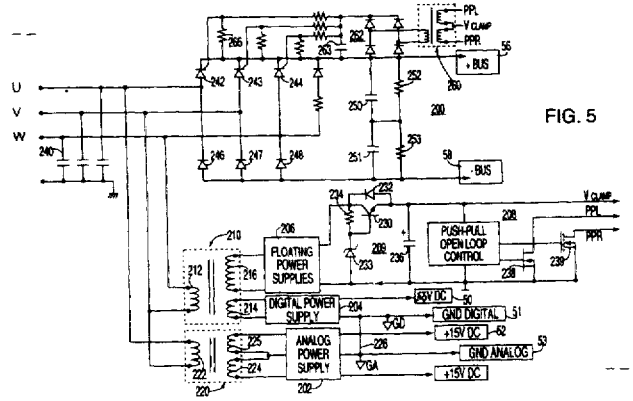

FIG. 5

UNITED STATES PATENT AND TRADEMARK OFFICE
CERTIFICATE OF CORRECTION

PATENT NO. : 5,625,265
DATED : April 29, 1997
INVENTOR(S) : Saso P. Vlahu

It is certified that error appears in the above-identified patent and that said Letters Patent is hereby corrected as shown below:

Column 3,
Line 46, change "20" to -- 10 --.

Column 4,
Line 17, before "22" insert -- , of digital section --;
Line 18, before "24" insert -- analog section --;
Line 42, after "but" insert -- it --;
Line 45, before "supply" insert -- power --; after "supply" insert -- via conductor --;
Line 47, before "supply" insert -- power --; after "supply" insert -- via conductor --;
Line 47, after "52" insert -- and --;
Line 49, before "supply" insert -- power --; after "supply" insert -- via conductor --;
Line 56, after "primary" insert -- winding --.

Column 6,
Line 7, cancel "require" and insert therefor -- required --;
Line 11, cancel "a" and insert therefor -- an --;
Line 49, cancel "84" and insert therefor -- 88 --;
Line 56, cancel "84" and insert therefor -- 88 --;

Column 7,
Line 34, cancel "register" and insert therefor -- resistor --;
Line 39, after "stage" insert -- 112 --;
Line 49, cancel "10" and insert therefore -- 110 --;
Line 55, after "diodes" insert -- 126 and 128 --;
Line 62, after "secondary winding" insert -- 42 --;

Column 8,
Line 11, after "bipolar transistor" insert -- 134 --;
Line 66, after "source conductors" insert -- U, V and W --.

Column 9,
Line 11, after "50" insert -- (shown in FIG. 1) --;
Line 50, after "208" insert -- (FIG. 5) --;
Line 52, after "239" insert -- (FIG. 5) --;
Line 62, cancel "The" and insert therefor -- As seen in FIG. 5 --;

UNITED STATES PATENT AND TRADEMARK OFFICE
CERTIFICATE OF CORRECTION

PATENT NO. : 5,625,265
DATED : April 29, 1997
INVENTOR(S) : Saso P. Vlahu

It is certified that error appears in the above-identified patent and that said Letters Patent is hereby corrected as shown below:

Column 10,
Line 5, cancel "A" and insert therefor -- As also seen in FIG. 5 --;
Line 15, after "34" insert -- (as shown in FIGS. 1, 2, 3 and 4) --;
Line 16, after "210" insert -- which is shown in FIG. 5 --;
Line 17, after "202" insert -- (FIG. 5) --;
Line 18, after "24" insert -- (FIGS. 1 and 3) --;
Line 23, after "transformer" insert -- (FIG. 5) --;
Line 45, after "34" insert -- as --;
Line 61, cancel "therefore" and insert therefor -- therefor --.

Column 11,
Line 17, cancel "274 and 278" and insert therefor -- 74 and 78 --.

Signed and Sealed this

Eighteenth Day of December, 2001

Attest:

Attesting Officer

JAMES E. ROGAN
Director of the United States Patent and Trademark Office